(12) United States Patent
Sakurai et al.

(10) Patent No.: US 8,710,902 B2
(45) Date of Patent: Apr. 29, 2014

(54) TRIMMING CIRCUIT AND SEMICONDUCTOR DEVICE

(75) Inventors: Atsushi Sakurai, Chiba (JP); Kazuaki Sano, Chiba (JP); Fumihiko Maetani, Chiba (JP); Satoshi Abe, Chiba (JP)

(73) Assignee: Seiko Instruments Inc., Chiba (JP)

( * ) Notice: Subject to any disclaimer, the term of this patent is extended or adjusted under 35 U.S.C. 154(b) by 83 days.

(21) Appl. No.: 13/474,906

(22) Filed: May 18, 2012

(65) Prior Publication Data

US 2012/0299630 A1     Nov. 29, 2012

(30) Foreign Application Priority Data

May 24, 2011    (JP) .................................. 2011-116032

(51) Int. Cl.
*H01H 37/76*     (2006.01)
(52) U.S. Cl.
USPC .......................................... 327/525; 327/524
(58) Field of Classification Search
USPC .................. 327/306, 524, 525; 365/225.7
See application file for complete search history.

(56) References Cited

U.S. PATENT DOCUMENTS

| 4,412,241 A | * | 10/1983 | Nelson | 257/529 |
| 2002/0003447 A1 | * | 1/2002 | Nagase et al. | 327/530 |
| 2008/0012624 A1 | * | 1/2008 | Kamatani | 327/525 |

FOREIGN PATENT DOCUMENTS

JP     2009-212415 A     9/2009

\* cited by examiner

*Primary Examiner* — Long Nguyen
(74) *Attorney, Agent, or Firm* — Brinks Gilson & Lione

(57) ABSTRACT

Provided are a trimming circuit which does not need a dedicated terminal to which a current for cutting a fuse is input, and also a semiconductor device including the trimming circuit. The trimming circuit includes: an input terminal connected to a pad which is an external terminal of an internal circuit; a fuse provided between a power supply terminal and an output terminal; and a diode provided between the input terminal and the output terminal. The trimming circuit performs trimming by applying, to the pad, such a voltage that the diode is biased in the forward direction.

5 Claims, 5 Drawing Sheets

TRIMMING CIRCUIT AND SEMICONDUCTOR DEVICE

RELATED APPLICATIONS

This application claims priority under 35 U.S.C. §119 to Japanese Patent Application No. 2011-116032 filed on May 24, 2011, the entire content of which is hereby incorporated by reference.

BACKGROUND OF THE INVENTION

1. Field of the Invention

The present invention relates to a trimming circuit to be used for function setting or characteristics adjustment of a circuit in a semiconductor integrated circuit.

2. Description of the Related Art

In a circuit of a semiconductor device, such as a voltage detection circuit or a voltage setting circuit, a resistor circuit for setting a voltage is provided with a trimming circuit for resistors in order to adjust the voltage (see, for example, Japanese Patent Application Laid-open No. 2009-212415).

FIG. 5 is a circuit diagram of a conventional trimming circuit.

Description is given of the case of cutting a fuse F1 in a conventional trimming circuit 1.

A decode circuit 2 outputs a voltage of high level to a gate of an NMOS transistor N1, and outputs a voltage of low level to gates of NMOS transistors N2 to N4. The NMOS transistor N1 is turned ON and the NMOS transistors N2 to N4 are turned OFF. At this time, a current flows from a pad TRIM, which is a current supply terminal for fuse cutting, to a ground terminal via a diode D1, the fuse F1, and the NMOS transistor N1. The fuse F1 is cut by this current, and a resistor R1 is added in series into a resistor circuit. Further, a current also flows from the pad TRIM to the ground terminal via a diode D2, a fuse F2, a resistor R5, and the NMOS transistor N1. However, the current flows through the current limiting resistor R5, and hence the fuse F2 is not cut by this current.

In this way, a transistor to be turned ON is selected by the decode circuit 2 so that a desired fuse may be cut, thereby being capable of adding a desired resistor into the resistor circuit.

The conventional trimming circuit, however, needs a terminal (pad TRIM) to which a current for cutting a fuse is input. Therefore, there is a problem in that the chip size increases.

SUMMARY OF THE INVENTION

The present invention has been made in view of the above-mentioned problem, and provides a trimming circuit which does not need a terminal dedicated for trimming, and also provides a semiconductor device including the trimming circuit.

In order to solve the above-mentioned problem, a trimming circuit according to an exemplary embodiment of the present invention includes: an input terminal connected in common to a pad which is an external terminal of an internal circuit; a first output terminal connected to a resistor circuit; a first fuse which is provided between a first power supply terminal and the first output terminal and is connected in parallel to one resistor of the resistor circuit; and a first diode provided between the input terminal and the first output terminal.

A trimming circuit according to another exemplary embodiment of the present invention further includes: a second output terminal connected to the resistor circuit; a second fuse which is provided between a second power supply terminal and the second output terminal and is connected in parallel to another resistor of the resistor circuit; and a second diode provided between the input terminal and the second output terminal.

According to the trimming circuits of the exemplary embodiments of the present invention, a terminal to which a current for cutting a fuse is input can serve also as a terminal of an internal circuit. Therefore, a terminal dedicated for trimming is unnecessary, and hence the chip size can be reduced.

DETAILED DESCRIPTION OF THE PREFERRED EMBODIMENTS

Hereinafter, embodiments of the present invention are described with reference to the accompanying drawings.

(First Embodiment)

Figure 1:
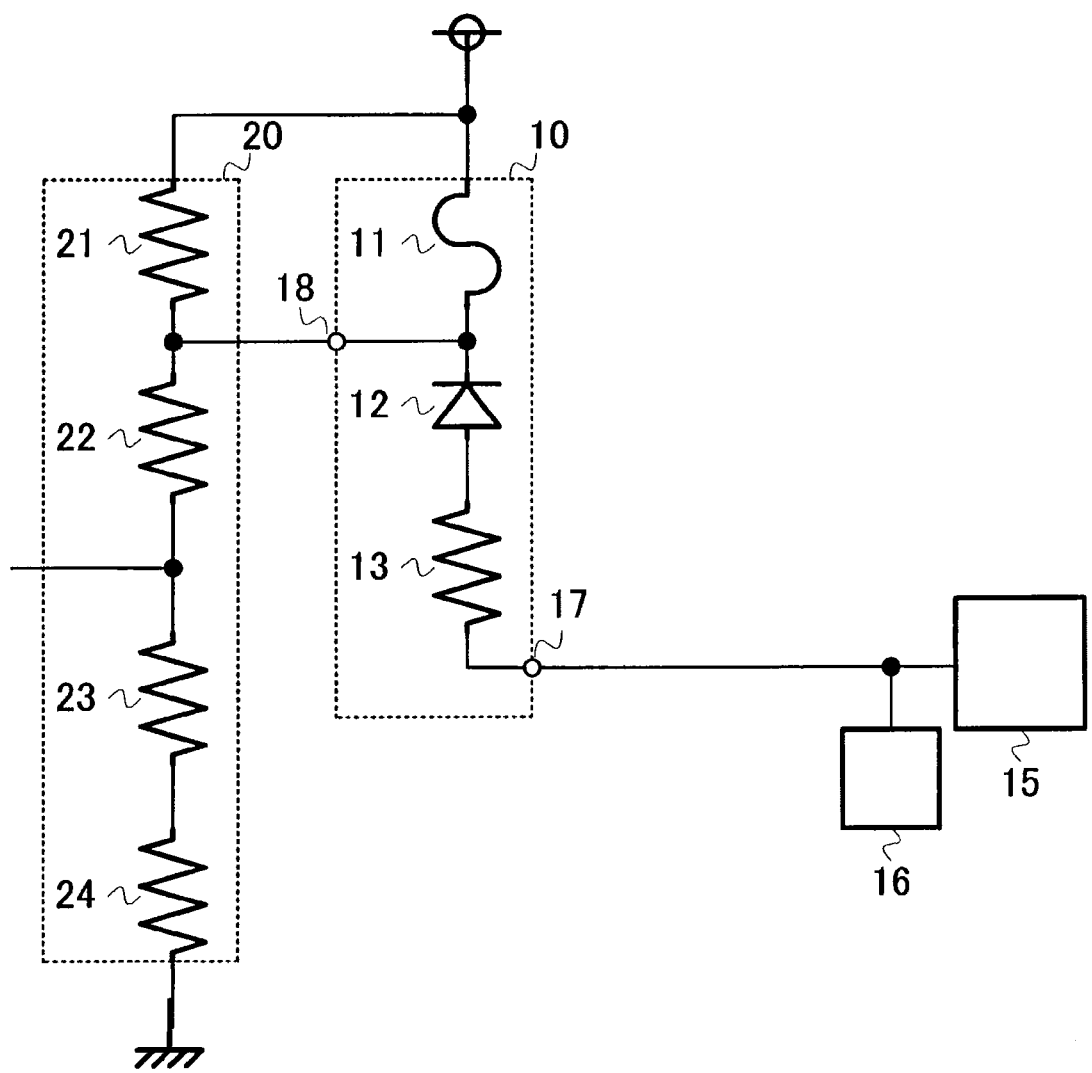
FIG. 1 is a circuit diagram illustrating a trimming circuit according to a first embodiment of the present invention.

FIG. 1 is a circuit diagram illustrating a trimming circuit according to a first embodiment of the present invention.

A trimming circuit 10 includes a fuse 11, a diode 12, a current limiting resistor 13, an input terminal 17, and an output terminal 18.

The fuse 11, the diode 12, and the current limiting resistor 13 are connected in series between a power supply terminal and the input terminal 17. The output terminal 18 is connected between the fuse 11 and the diode 12.

The input terminal 17 is connected to a pad 16 which is an external terminal of an internal circuit 15. The output terminal 18 is connected between resistors 21 and 22 of a resistor circuit 20 including the resistors 21 and 22 and resistors 23 and 24. Therefore, the fuse 11 is connected in parallel to the resistor 21.

Next, the operation of the trimming circuit 10 is described.

First, the case of cutting the fuse 11 is described. To the pad 16, a voltage equal to or higher than a voltage obtained by adding a threshold voltage of the diode 12 to a power supply voltage is applied. The diode 12 is biased in the forward direction, thereby allowing a current to flow. Accordingly, a current flows from the pad 16 to the power supply terminal via the fuse 11. The fuse 11 is cut by this current.

Next, the operation of the trimming circuit 10 in normal use is described. In normal use, a voltage equal to or lower than the power supply voltage is applied to the pad 16. At this time, the diode 12 is biased in the reverse direction, and hence no current flows. Therefore, the fuse 11 is not cut. Then, the pad 16 functions only as a terminal of the internal circuit 15.

Figure 2:
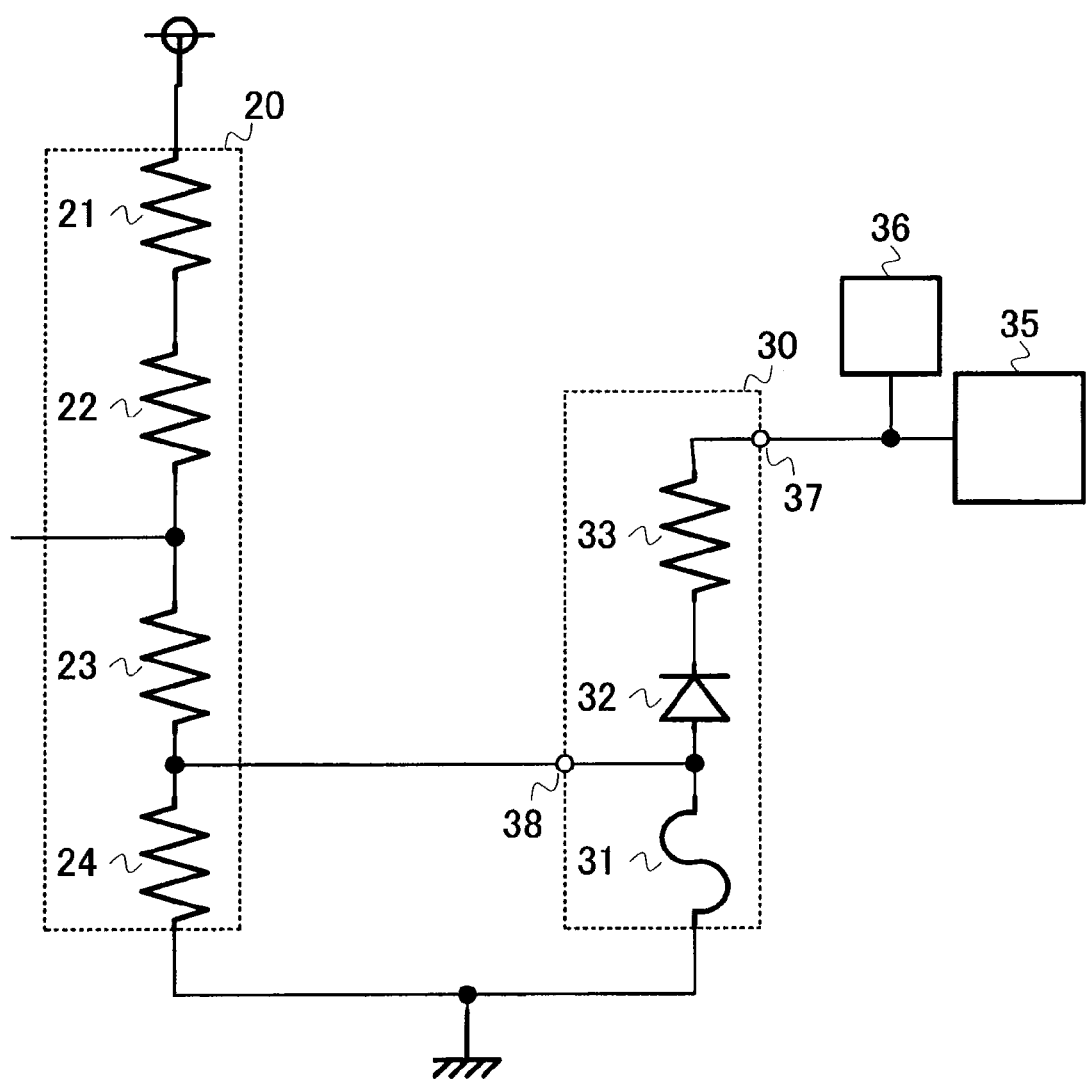
FIG. 2 is a circuit diagram illustrating another example of the trimming circuit according to the first embodiment of the present invention.

Note that, the trimming circuit 10 is configured so that the fuse 11 is cut through the application of a voltage equal to or higher than the power supply voltage to the pad 16, but the trimming circuit 10 may be configured as illustrated by a trimming circuit 30 of FIG. 2.

In the trimming circuit 30, a fuse 31, a diode 32, and a current limiting resistor 33 are connected in series between an input terminal 37 and a ground terminal. An output terminal 38 is connected between the fuse 31 and the diode 32.

The input terminal 37 is connected to a pad 36 which is an external terminal of an internal circuit 35. The output terminal 38 is connected between the resistor 23 and the resistor 24. That is, the fuse 31 is connected in parallel to the resistor 24 in order to trim the resistor 24.

In the trimming circuit 30 of FIG. 2, in order to cut the fuse 31, a voltage equal to or lower than a voltage obtained by subtracting a threshold voltage of the diode 32 from a ground voltage is applied to the pad 36.

Figure 3:
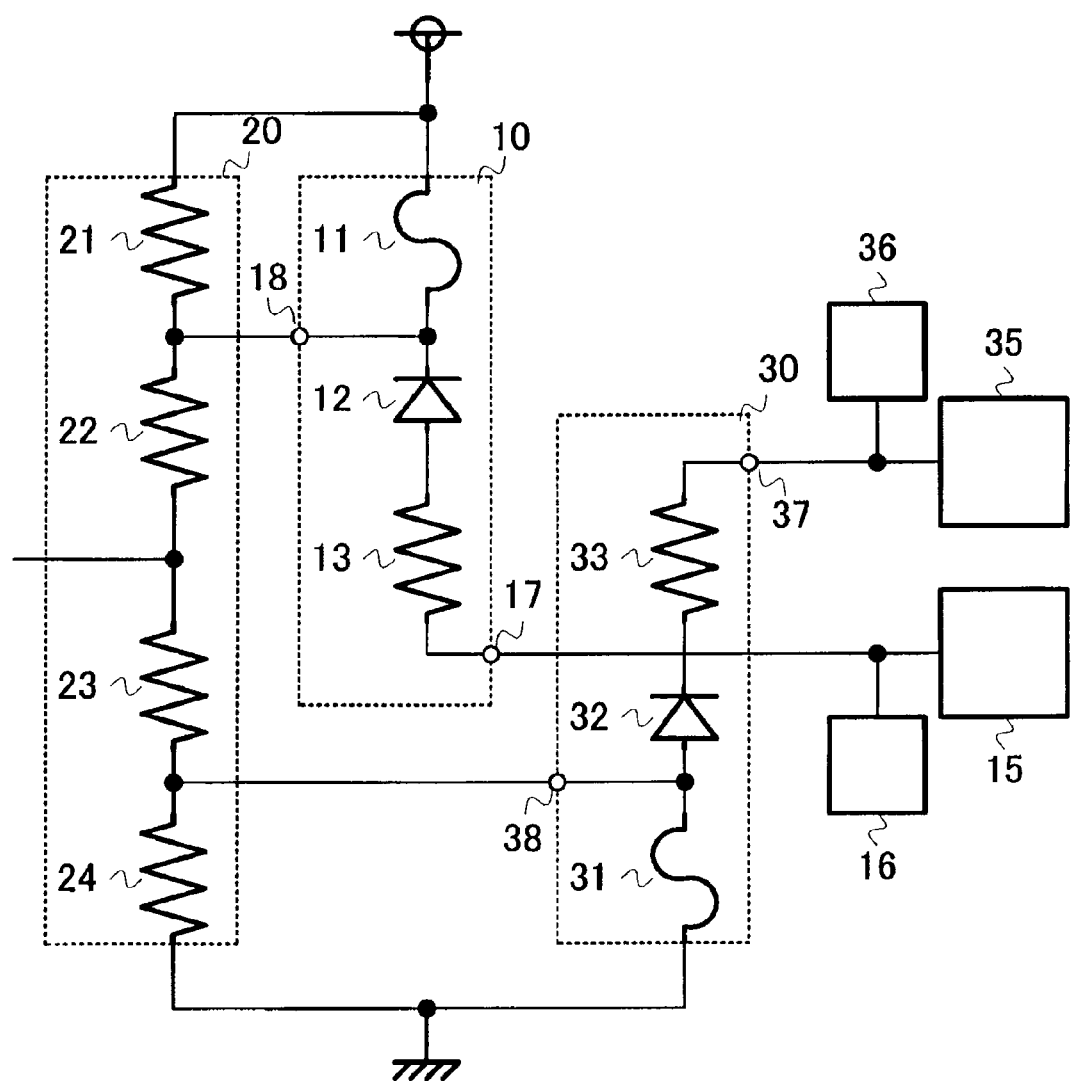
FIG. 3 is a circuit diagram illustrating still another example of the trimming circuit according to the first embodiment of the present invention.

Alternatively, as illustrated in FIG. 3, both the trimming circuit 10 and the trimming circuit 30 may be provided.

Note that, the current limiting resistor 13 and the current limiting resistor 33 are provided for improving noise resistance of the pad 16 and the pad 36, respectively. Therefore, if there is no problem on the noise resistance of the pads, the current limiting resistor 13 and the current limiting resistor 33 do not need to be provided.

As described above, according to the trimming circuit of the present invention, the terminal to which a current for cutting the fuse is input can serve also as a terminal of the internal circuit. Therefore, a terminal dedicated for trimming is unnecessary, and hence the chip size can be reduced.

(Second Embodiment)

Figure 4:
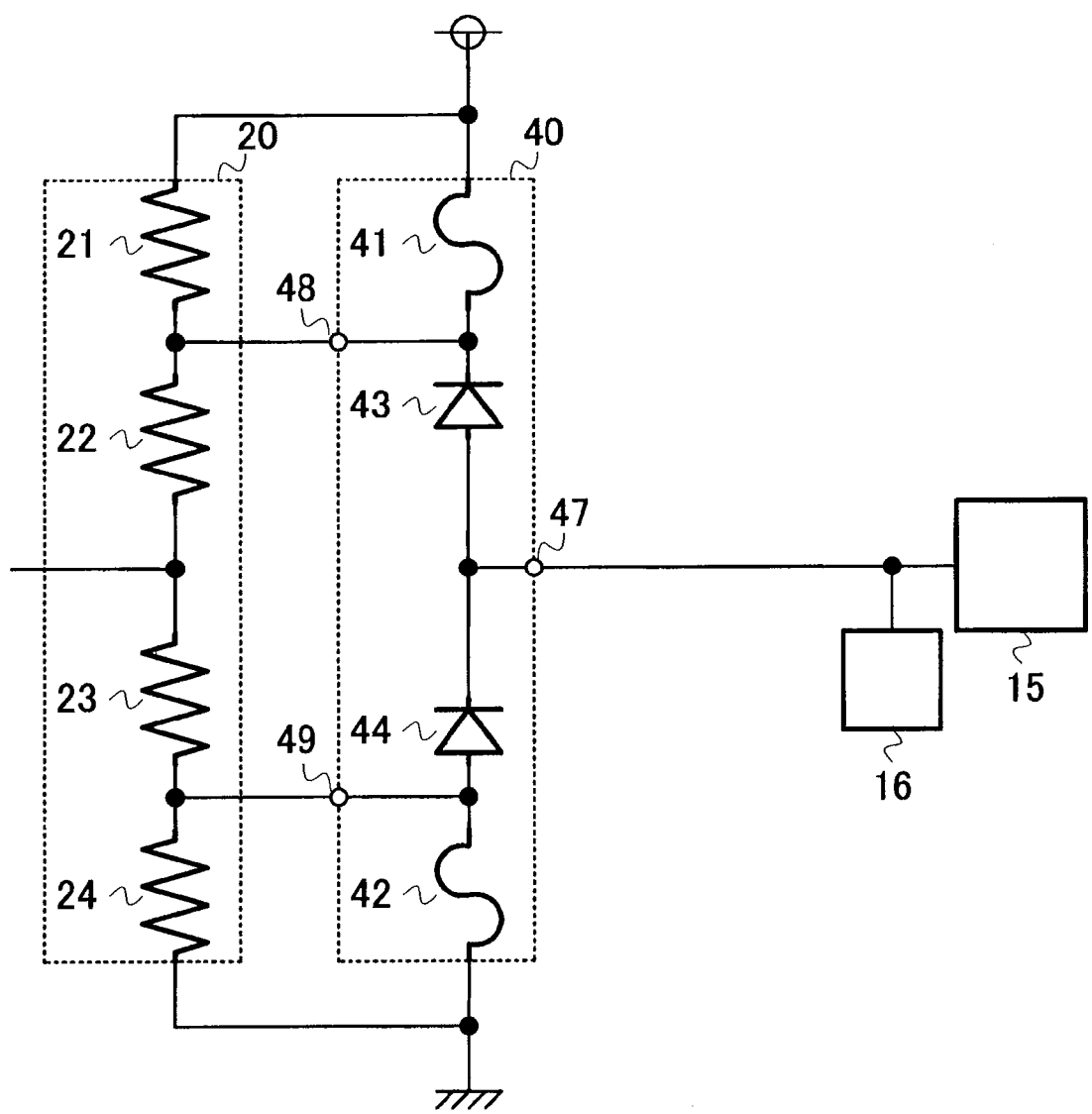
FIG. 4 is a circuit diagram illustrating a trimming circuit according to a second embodiment of the present invention.
Figure 5:
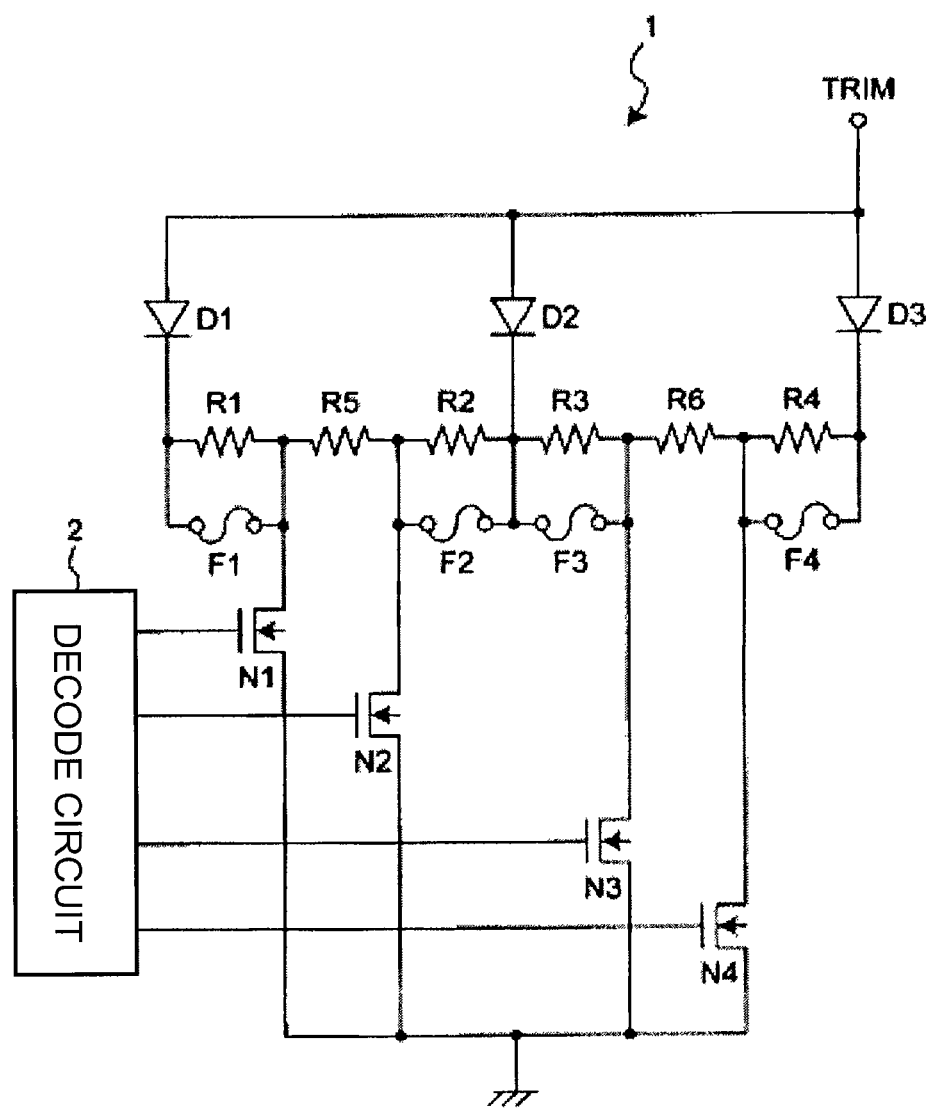
FIG. 5 is a circuit diagram of a conventional trimming circuit.

FIG. 4 is a circuit diagram illustrating a trimming circuit according to a second embodiment of the present invention.

A trimming circuit 40 includes a fuse 41, a diode 43, a diode 44, a fuse 42, an input terminal 47, an output terminal 48, and an output terminal 49.

The fuse 41, the diode 43, the diode 44, and the fuse 42 are connected in series between a power supply terminal and a ground terminal. The input terminal 47 is connected between the diode 43 and the diode 44 and also connected to a pad 16 which is an external terminal of an internal circuit 15. The output terminal 48 is connected between the fuse 41 and the diode 43 and also connected to a resistor circuit 20. The output terminal 49 is connected between the diode 44 and the fuse 42 and also connected to the resistor circuit 20.

The fuse 41 is connected in parallel to the resistor 21 in order to trim the resistor 21 of the resistor circuit 20. The fuse 42 is connected in parallel to the resistor 24 in order to trim the resistor 24 of the resistor circuit 20.

Next, the operation of the trimming circuit 40 is described.

First, the case of cutting the fuse 41 is described. To the pad 16, a voltage equal to or higher than a voltage obtained by adding a threshold voltage of the diode 43 to a power supply voltage is applied. The diode 43 is biased in the forward direction, thereby allowing a current to flow. Accordingly, a current flows from the pad 16 to the power supply terminal via the fuse 41. The fuse 41 is cut by this current.

Next, the case of cutting the fuse 42 is described. To the pad 16, a voltage equal to or lower than a voltage obtained by subtracting a threshold voltage of the diode 44 from a ground voltage is applied. The diode 44 is biased in the forward direction, thereby allowing a current to flow. Accordingly, a current flows from the ground terminal to the pad 16 via the fuse 42. The fuse 42 is cut by this current.

Next, the operation of the trimming circuit 40 in normal use is described. In normal use, a voltage equal to or lower than the power supply voltage and equal to or higher than the ground voltage is applied to the pad 16. At this time, the diode 43 and the diode 44 are biased in the reverse direction, and hence no current flows. Therefore, the fuse 41 and the fuse 42 are not cut. Then, the pad 16 functions only as a terminal of the internal circuit 15.

In the trimming circuit 40, in order to adjust a resistance value of the resistor circuit 20, one of the fuse 41 and the fuse 42 is cut. In this case, a circuit including a fuse which is left uncut functions an ESD protection circuit for the pad 16. Therefore, the diode of the trimming circuit 40 also has the function of the ESD protection circuit, and hence the ESD protection circuit is not necessarily provided for the pad 16. That is, the number of circuits is reduced, and the chip size can be reduced more.

As described above, according to the trimming circuit of the present invention, the terminal to which a current for cutting a fuse is input can serve also as a terminal of the internal circuit. Therefore, a terminal dedicated for trimming is unnecessary, and hence the chip size can be reduced. Besides, the diode of the trimming circuit also has the function of an ESD protection circuit, and hence the chip size can be reduced more.

What is claimed is:

1. A trimming circuit for trimming a resistor circuit, the resistor circuit including a plurality of resistors connected in series between a power supply terminal and a ground terminal, the trimming circuit comprising:
   an input terminal connected in common to a pad that comprises an external terminal of an internal circuit;
   an output terminal connected to the resistor circuit;
   a fuse directly connected to the output terminal and connected in parallel to a selected resistor of the plurality of resistors of the resistor circuit, the fuse and the selected resistor directly connected to either the power supply terminal or to the ground terminal; and
   a reverse biased diode directly connected to the input terminal and to the fuse,
   wherein the trimming circuit trims the resistor circuit by applying a voltage to the pad, such that a current flows from the pad to the power supply terminal or to the ground terminal only via the fuse and the reverse biased diode is biased in a forward direction.

2. A trimming circuit according to claim 1, further comprising:
   a second output terminal connected to the resistor circuit;
   a second fuse which is provided between the second power supply terminal and the second output terminal and is connected in parallel to another one of the plurality of resistors of the resistor circuit; and
   a second diode provided between the input terminal and the second output terminal,
   wherein the trimming circuit performs trimming by applying, to the pad, one of such a voltage that the first diode is biased in the forward direction and such a voltage that the second diode is biased in the forward direction.

3. A trimming circuit according to claim 1 further comprising:
   a second trim circuit having a second input terminal connected to a second pad and a second output terminal connected to the resistor circuit, the second trim circuit including,
   a fuse directly connected to the second output terminal and connected in parallel to a second selected resistor of the plurality of resistors of the resistor circuit, the fuse and the second selected resistor directly connected to the ground terminal and a reverse biased diode directly connected to the second input terminal and to the fuse.

4. A trimming circuit comprising:

a resistor circuit including a plurality of resistors connected in series between a first power supply terminal and a second power supply terminal, the trimming circuit further comprising:

an input terminal connected in common to a pad which is an external terminal of an internal circuit;

an output terminal connected to the resistor circuit;

a fuse between the first power supply terminal and the first output terminal and connected in parallel to one of the plurality of resistors of the resistor circuit; and a diode provided between the input terminal and the first output terminal;

a current limiting resistor connected between the input terminal and the first output terminal and in series with the diode, wherein the trimming circuit performs trimming by applying, to the pad, such a voltage that the diode is biased in a forward direction.

5. A semiconductor device comprising:

a resistor circuit including a plurality of series-connected resistors;

an internal circuit having a predetermined function;

a pad connected to the internal circuit, the pad comprising an external terminal; and a trimming circuit comprising:

an input terminal connected in common to the pad;

an output terminal connected to the resistor circuit;

a fuse directly connected to the output terminal and connected in parallel to a selected resistor of the plurality of resistors of the resistor circuit, the fuse and the selected resistor directly connected to either the power supply terminal or to the ground terminal; and a reverse biased diode directly connected to the input terminal and to the fuse, wherein the trimming circuit trims the resistor circuit by applying a voltage to the pad, such that a current flows from the pad to the power supply terminal or to the ground terminal only via the fuse and the reverse biased diode is biased in a forward direction.

* * * * *